US012660320B2

(12) United States Patent
Choi et al.

(10) Patent No.: US 12,660,320 B2
(45) Date of Patent: Jun. 16, 2026

(54) THIN FILM TRANSISTOR ARRAY SUBSTATE AND DISPLAY DEVICE INCLUDING THE SAME

(71) Applicant: LG Display Co., Ltd., Seoul (KR)

(72) Inventors: Hong Rak Choi, Paju-si (KR); Do Hyung Lee, Paju-si (KR); Young Hyun Ko, Paju-si (KR); Chan Yong Jeong, Paju-si (KR); Sung Ju Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 352 days.

(21) Appl. No.: 18/231,396

(22) Filed: Aug. 8, 2023

(65) Prior Publication Data

US 2024/0120343 A1      Apr. 11, 2024

(30) Foreign Application Priority Data

Sep. 30, 2022     (KR) ........................ 10-2022-0125097

(51) Int. Cl.
*H01L 27/12* (2006.01)
*H10D 86/40* (2025.01)
(Continued)

(52) U.S. Cl.
CPC ........... *H10D 86/60* (2025.01); *H10D 86/423* (2025.01); *H10K 59/126* (2023.02)

(58) Field of Classification Search
CPC ...... H10D 86/60; H10D 86/423; H10D 86/40; H10D 86/431; H10D 86/481;
(Continued)

(56) References Cited

U.S. PATENT DOCUMENTS 8,198,666 B2 * 6/2012 Asami .................... H10D 89/10
                                                          257/314
10,153,446 B2 * 12/2018 Maruyama ......... H10K 59/1213
                                   (Continued)

FOREIGN PATENT DOCUMENTS

KR            10-1652088 B1        8/2016
KR      10-2018-0034210 A         4/2018
KR      10-2021-0129788 A        10/2021

*Primary Examiner* — Nikolay K Yushin
(74) *Attorney, Agent, or Firm* — Birch, Stewart, Kolasch & Birch, LLP

(57) ABSTRACT

A thin film transistor array substrate including a substrate including an active area and a non-active area, and a first thin film transistor disposed on the substrate while including a first oxide semiconductor pattern, a first gate electrode overlapping with the first oxide semiconductor pattern, a first gate insulating layer interposed between the first oxide semiconductor pattern and the first gate electrode, a first source electrode and a first drain electrode disposed on and connected to the first oxide semiconductor pattern, and a first light shielding pattern disposed under the first oxide semiconductor pattern and electrically connected to one of the first source electrode and the first drain electrodes. The first gate electrode includes a first portion maintaining a first parasitic capacitance and a second portion maintaining a second parasitic capacitance smaller than the first parasitic capacitance, together with the first oxide semiconductor pattern.

20 Claims, 10 Drawing Sheets

(51) Int. Cl.
  H10D 86/60      (2025.01)
  H10K 59/126      (2023.01)
(58) Field of Classification Search
  CPC ............... H10D 30/6723; H10D 30/67; H10D
        30/6734; H10D 30/6755; H10D 30/6757;
        H10K 59/126; H10K 59/1213; H10K
        59/121; H10K 59/1216; H10K 2102/351;
        H10K 2102/311; H10K 2102/3026
  See application file for complete search history.

(56)                References Cited

U.S. PATENT DOCUMENTS

| | | | |
|---|---|---|---|
| 11,594,559 B2 * | 2/2023 | Park ..................... | H10D 86/423 |
| 2010/0213531 A1 * | 8/2010 | Asami .................... | H10B 41/30 |
| | | | 438/164 |
| 2018/0090695 A1 * | 3/2018 | Maruyama ........... | H10D 86/423 |
| 2021/0327910 A1 * | 10/2021 | Park ................... | H10D 86/0221 |

* cited by examiner

THIN FILM TRANSISTOR ARRAY SUBSTATE AND DISPLAY DEVICE INCLUDING THE SAME

CROSS-REFERENCE TO RELATED APPLICATIONS

This application claims priority to Korean Patent Application No. 10-2022-0125097, filed in the Republic of Korea on Sep. 30, 2022, the entire contents of which is hereby expressly incorporated by reference into the present application.

BACKGROUND OF THE DISCLOSURE

Field of the Disclosure

The present disclosure relates to an array substrate of a thin film transistor including an oxide semiconductor pattern, and more particularly to a thin film transistor array substrate enabling a thin film transistor disposed on a substrate to achieve an enhancement in low-grayscale expression and blockage of leakage current, and a display device including the same. In particular, the present disclosure relates to a display device in which a driving thin film transistor configured to drive a pixel has a widened grayscale expression range and an increased s-factor value, thereby being capable of realizing a rapid on/off operation while achieving grayscale expression in a wide range.

Discussion of the Related Art

Recently, according to advances in multimedia, the importance of a flat display device has increased. To cope with such a situation, flat display devices, such as a liquid crystal display device (LCD), a plasma display device, an organic light emitting display device (OLED), etc. are being commercialized. Among such flat display devices, the organic light emitting display device is currently mainly used in that the display device has fast response time, high luminance, and a wide viewing angle.

In such an organic light emitting device, a plurality of pixels is disposed in a matrix, and each of the pixels includes a light emitting device part represented by an organic light emitting layer and a pixel circuit part represented by a thin film transistor (hereinafter referred to as a "TFT"). The pixel circuit part includes a driving TFT configured to operate an organic light emitting element through supply of drive current and a switching TFT configured to supply a gate signal to the driving TFT.

In addition, a gate driving circuit part configured to provide a gate signal to each pixel can be disposed in a non-active area of the organic light emitting display device. In connection with this, the present disclosure relates to an array substrate of a thin film transistor disposed at a pixel, in particular, a pixel circuit part of a sub-pixel, and configured to block leakage current in an off state and to achieve free grayscale expression even at low gray levels, and a display device including the same.

SUMMARY OF THE DISCLOSURE

Accordingly, the present disclosure is directed to a thin film transistor array substrate and a display device including the same that substantially obviate one or more problems due to limitations and disadvantages of the related art.

An object of the present disclosure is to provide a thin film transistor disposed within a pixel and configured to exhibit a high effect of blocking leakage current in an off state and to achieve grayscale expression within a wide range (e.g., a wide range of grayscale expression).

Another object of the present disclosure is to provide sub-thin film transistors included in one thin film transistor while having threshold voltages adjusted to be different from one another, thereby providing a driving thin film transistor capable of achieving free grayscale expression even at low gray levels while using an oxide semiconductor pattern as an active layer thereof.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and according to the purpose of the disclosure, as embodied and broadly described herein, a thin film transistor array substrate includes a substrate including an active area and a non-active area disposed around the active area, and a first thin film transistor disposed on the substrate, wherein the first thin film transistor includes a first oxide semiconductor pattern disposed on the substrate, a first gate electrode overlapping with the first oxide semiconductor pattern, a first gate insulating layer interposed between the first oxide semiconductor pattern and the first gate electrode, a first source electrode and a first drain electrode disposed on the first oxide semiconductor pattern and connected to the first oxide semiconductor pattern, and a first light shielding pattern disposed under the first oxide semiconductor pattern and electrically connected to one of the first source electrode and the first drain electrode, and wherein the first gate electrode includes a first portion maintaining a first parasitic capacitance, together with the first oxide semiconductor pattern, and a second portion maintaining a second parasitic capacitance smaller than the first parasitic capacitance, together with the first oxide semiconductor pattern.

The first parasitic capacitance can be generated according to maintenance of a first vertical distance between the first oxide semiconductor pattern and the first portion of the first gate electrode, and the second parasitic capacitance can be generated according to maintenance of a second vertical distance between the first oxide semiconductor pattern and the second portion of the first gate electrode. The second vertical distance is greater than the first vertical distance.

The first gate insulating layer can include a sink recessed toward the first oxide semiconductor pattern.

The first oxide semiconductor pattern can include a first source region connected to the first source electrode, a first drain region connected to the first drain electrode, and a first channel region disposed between the first source region and the first drain region. The sink can have a length equal to or greater than a length of the first channel region.

The first gate electrode can overlap with the first channel region, and can extend in a width direction of the first channel region along a curvature of an upper surface of the first gate insulating layer including the sink.

A portion of the first gate electrode can be formed at the sink, and the first gate electrode can have a length equal to the length of the first channel region.

A thickness of the first gate insulating layer in a region between the first portion of the first gate electrode and the first oxide semiconductor pattern can be smaller than a thickness of the first gate insulating layer in a region between the second portion of the first gate electrode and the first oxide semiconductor pattern.

The sink can be disposed in a number of at least one in the width direction of the first channel region.

The first gate insulating layer can include at least one inorganic insulating layer.

The first gate insulating layer can include a first inorganic insulating layer covering the oxide semiconductor pattern, and a second inorganic insulating layer disposed on the first inorganic insulating layer while including the sink.

The sink can be disposed at a central portion of the first channel region, and the second portion of the first gate electrode can be disposed at opposite sides of the sink.

The first thin film transistor can be a driving thin film transistor configured to drive a pixel disposed in the active area.

The sink can have a quadrangular shape in plan view.

The thin film transistor array substrate can further include a second thin film transistor disposed in the active area. The second thin film transistor can include a second oxide semiconductor pattern, a second gate electrode disposed on the second oxide semiconductor pattern, a second light shielding pattern disposed under the second oxide semiconductor pattern while overlapping with the second oxide semiconductor pattern, and a second source electrode and a second drain electrode electrically connected to the second oxide semiconductor pattern.

The second gate electrode and the second light shielding pattern can be electrically interconnected to constitute a dual gate.

In another aspect of the present disclosure, there is provided a display device including the thin film transistor array substrate, and a light emitting device part disposed on the substrate. The light emitting device part includes a first electrode connected to the first drain electrode, a second electrode corresponding to the first electrode, and a light emitting layer disposed between the first electrode and the second electrode.

Objects of the present disclosure are not limited to the above-described objects, and other objects of the present disclosure not yet described will be more clearly understood by those skilled in the art from the following detailed description.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION OF THE EMBODIMENTS

Figure 1:
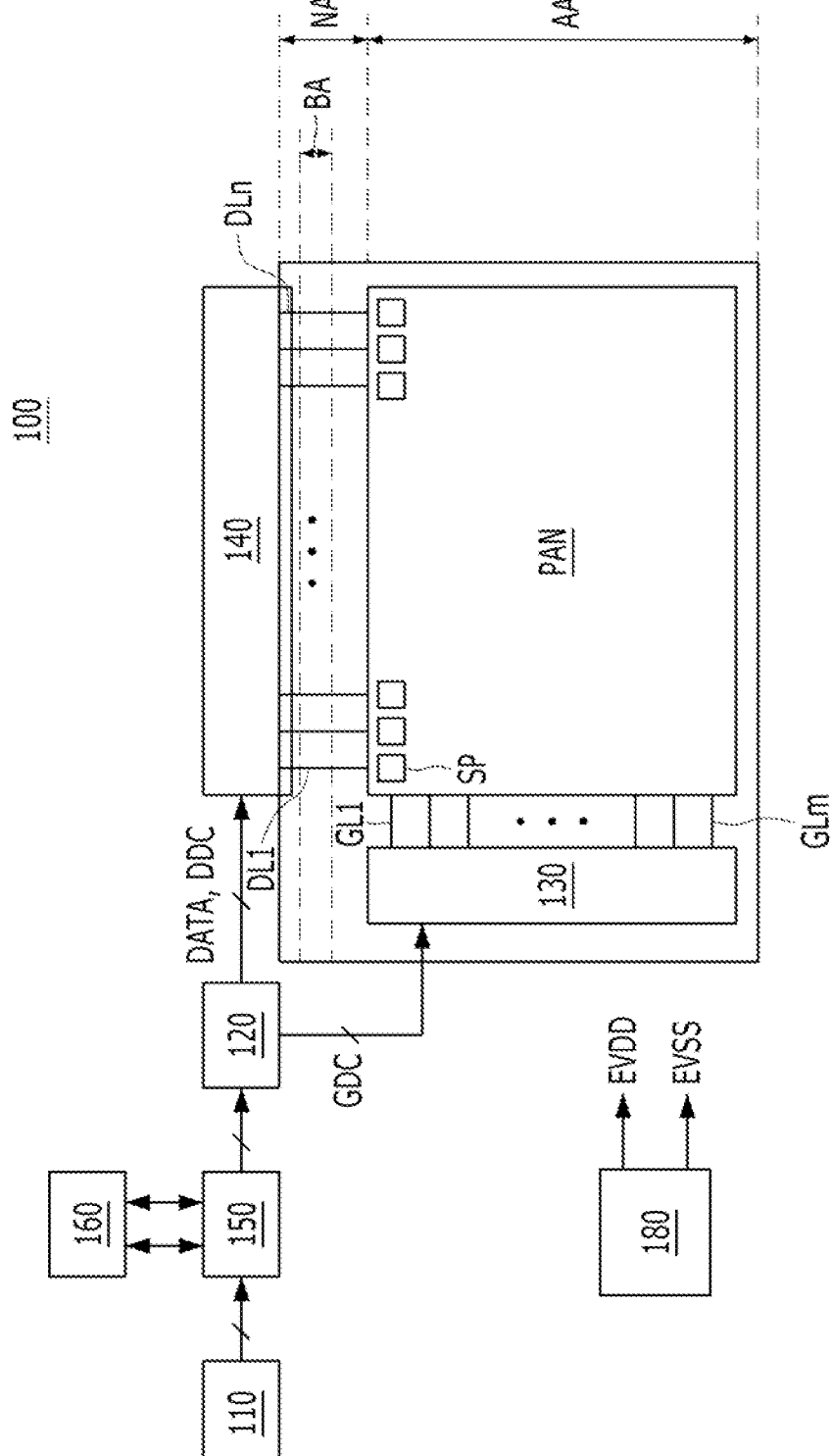
FIG. 1 is a schematic block diagram of a display device according to an exemplary embodiment of the present disclosure.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it can make the subject matter of the present disclosure rather unclear. The terms "comprises," "includes," and/or "has," used in this specification, do not preclude the presence or addition of other elements unless used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof. In the description of the various embodiments of the present disclosure, when describing positional relationships, for example, when the positional relationship between two parts is described using "on," "above," "below," "next to," or the like, one or more other parts can be located between the two parts unless the term "directly" or "closely" is used.

In the description of the various embodiments of the present disclosure, when describing temporal relationships, for example, when the temporal relationship between two actions is described using "after," "subsequently," "next," "before," or the like, the actions may not occur in succession unless the term "directly" or "just" is used therewith.

It can be understood that, although the terms "first," "second," etc. can be used herein to describe various elements, these elements are not to be limited by these terms. These terms are merely used to distinguish one element from another. Therefore, in the present specification, an element indicated by "first" can be the same as an element indicated by "second" without exceeding the technical scope of the present disclosure, unless mentioned otherwise.

The respective features of the various embodiments of the present disclosure can be partially or entirely coupled to and combined with each other, and various technical linkages and modes of operation thereof are possible. These various embodiments can be performed independently of each other, or can be performed in association with each other.

Hereinafter, a display device according to an exemplary embodiment of the present disclosure will be described in detail with reference to the accompanying drawings.

Figure 2:
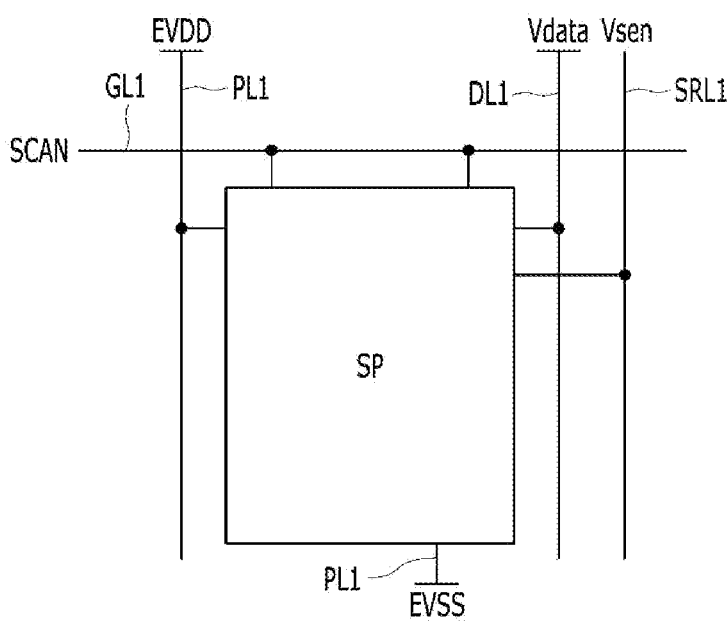
FIG. 2 is a schematic block diagram of a sub-pixel in the display device according to the exemplary embodiment of the present disclosure.

FIG. 1 is a schematic block diagram of a display device 100 according to the exemplary embodiment of the present disclosure, and FIG. 2 is a schematic block diagram of a sub-pixel SP shown in FIG. 1. As shown in FIG. 1, the display device 100 includes an image processor 110, a degradation compensator 150, a memory 160, a timing controller 120, a data driver 140, a power supply 180, a gate driver 130, and a display panel PAN formed with the gate driver 130 therein. A non-active area NA of the display panel PAN can include a bending area BA. The display panel PAN can be folded in the bending area BA and, as such, can reduce a bezel size.

The image processor 110 outputs drive signals for driving various devices, together with image data supplied from an exterior thereof. The degradation compensator 150 modulates input image data Idata of each sub-pixel SP of a current frame based on a sensing voltage Vsen (see FIG. 2) supplied from the data driver 140, and then supplies the modulated image data, for example, data Mdata, to the timing controller 120.

The timing controller 120 generates and outputs a gate timing control signal GDC for control of operation timing of the gate driver 130 and a data timing control signal DDC for control of operation timing of the data driver 140 based on a drive signal input from the image processor 110 thereto. The gate driver 130 outputs a scan signal to the display panel PAN in response to the gate timing control signal GDC supplied from the timing controller 120. The gate driver 130 outputs the scan signal through a plurality of gate lines GL1 to GLm. In particular, the gate driver 130 can be configured to (e.g., designed to) have a gate-in-panel (GIP) structure in which a thin film transistor is stacked (e.g., directly stacked) on a substrate in the display device 100 which can be an organic electroluminescent display device (OLED). The GIP can include a plurality of circuits, such as a shift register, a level shifter, etc.

The data driver 140 outputs a data voltage to the display panel PAN in response to the data timing control signal DDC input from the timing controller 120 thereto. The data driver 140 outputs the data voltage through a plurality of data lines DL1 to DLn. The power supply 180 outputs a high-level drive voltage EVDD, a low-level drive voltage EVSS, etc., and supplies the output voltages EVDD, EVSS, etc. to the display panel PAN. The high-level drive voltage EVDD and the low-level drive voltage EVSS are supplied to the display panel PAN through power lines.

The display panel PAN displays an image, corresponding to the data voltage and the scan signal respectively supplied from the data driver 140 and the gate driver 130, which can be disposed in the non-active area NA, and the display panel PAN can receive power from the power supply 180. An active area AA of the display panel PAN is constituted by a plurality of sub-pixels SP and, as such, the display panel PAN displays an actual image. The sub-pixels SP include a red (R) sub-pixel, a green (G) sub-pixel, and a blue (B) sub-pixel, or include a white (W) sub-pixel, a red (R) sub-pixel, a green (G) sub-pixel, and a blue (B) sub-pixel. In this instance, the W, R, G, and B sub-pixels SP can be formed to have the same area or can be formed to have different areas, respectively.

The memory 160 not only stores a look-up table for degradation compensation gains, but also stores a degradation compensation time point of an organic light emitting element of each sub-pixel SP. In this instance, the degradation compensation time point of the organic light emitting element can be the number of times when an organic light emitting display panel is driven or the time for which the organic light emitting display panel is driven.

As shown in FIG. 2, each sub-pixel SP can be connected to one gate line, for example, the gate line GL1, one data line, for example, the data line DL1, one sensing voltage read-out line, for example, a sensing voltage read-out line SRL1, and one power line, for example, a power line PL1. The numbers of transistors and capacitors of the sub-pixel SP and the driving method of the sub-pixel SP are determined according to a circuit configuration of the sub-pixel SP.

Figure 3:
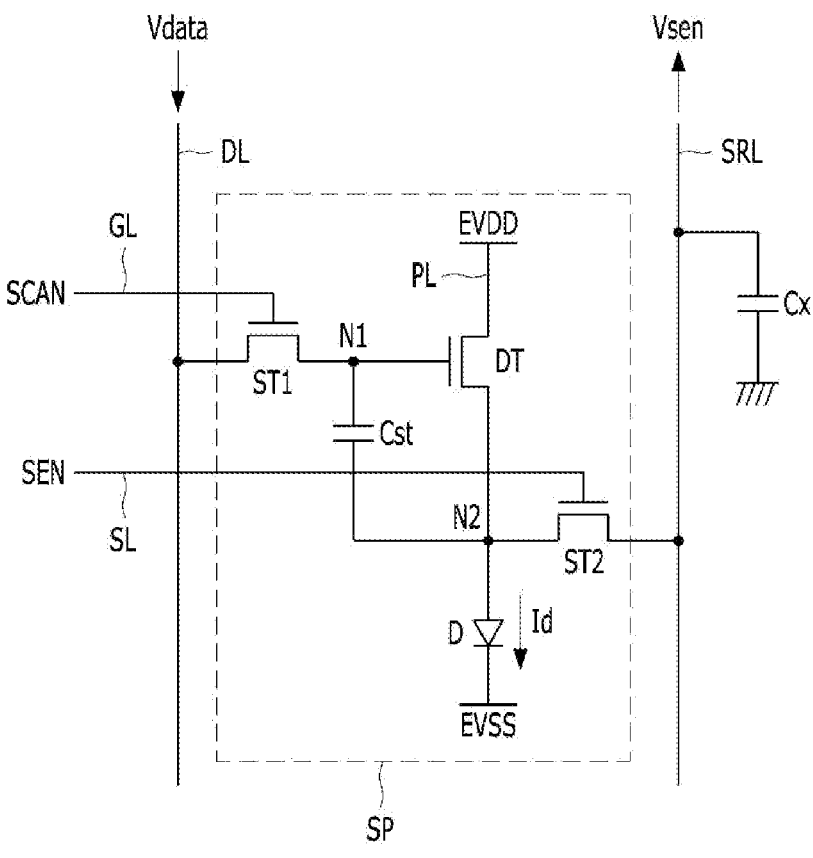
FIG. 3 is a circuit diagram of one sub-pixel of the display device according to the exemplary embodiment of the present disclosure.

Next, FIG. 3 is a circuit diagram of one sub-pixel SP of the display device 100 according to the exemplary embodiment of the present disclosure. As shown in FIG. 3, the display device 100 includes a gate line GL, a data line DL, a power line PL, and a sensing line SL intersecting one another, thereby defining a sub-pixel SP, and includes a driving thin film transistor DT, a light emitting element D, a storage capacitor Cst, a first switching thin film transistor ST1, and a second switching thin film transistor ST2 at the sub-pixel SP.

Further, the light emitting element D can include an anode connected to a second node N2, a cathode connected to an input terminal for a low-level drive voltage EVSS, and an organic light emitting layer disposed between the anode and the cathode. The driving thin film transistor DT controls current Id flowing through the light emitting element D according to a gate-source voltage Vgs thereof (see FIG. 5). In addition, the driving thin film transistor DT includes a gate electrode connected to a first node N1, a drain electrode connected to the power line PL, to receive a high-level drive voltage EVDD, and a source electrode connected to the second node N2. Further, the storage capacitor Cst is connected between the first node N1 and the second node N2.

When the display panel PAN is driven, the first switching thin film transistor ST1 applies a data voltage Vdata charged in the data line DL to the first node N1 in response to a scan signal SCAN, thereby turning on the driving thin film transistor DT. In this instance, the first switching thin film transistor ST1 includes a gate electrode connected to the gate line GL, to receive the scan signal SCAN, a drain electrode connected to the data line DL, to receive the data voltage Vdata, and a source electrode connected to the first node N1.

Also, the second switching thin film transistor ST2 stores a source voltage of the second node N2 in a sensing capacitor Cx of a sensing voltage read-out line SRL by switching current between the second node N2 and the sensing voltage read-out line SRL in response to a sensing signal SEN. In addition, the second switching thin film transistor ST2 resets a source voltage of the driving thin film transistor DT to an initialization voltage Vpre by switching current between the second node N2 and the sensing voltage read-out line SRL in response to the sensing signal SEN when the display panel PAN is driven. In this instance, in the second switching thin film transistor ST2, a gate electrode thereof is connected to the sensing line SL, a drain electrode thereof is connected to the second node N2, and a source electrode thereof is connected to the sensing voltage read-out line SRL.

Although a display device having a 3T1C structure including three thin film transistors and one storage capacitor has been illustrated and described, the display device of the present disclosure can be applied to various pixel structures, such as 4T1C, 5T1C, 6T1C, 7T1C, and 8T1C without being limited to the above-described structure.

Figure 4A:
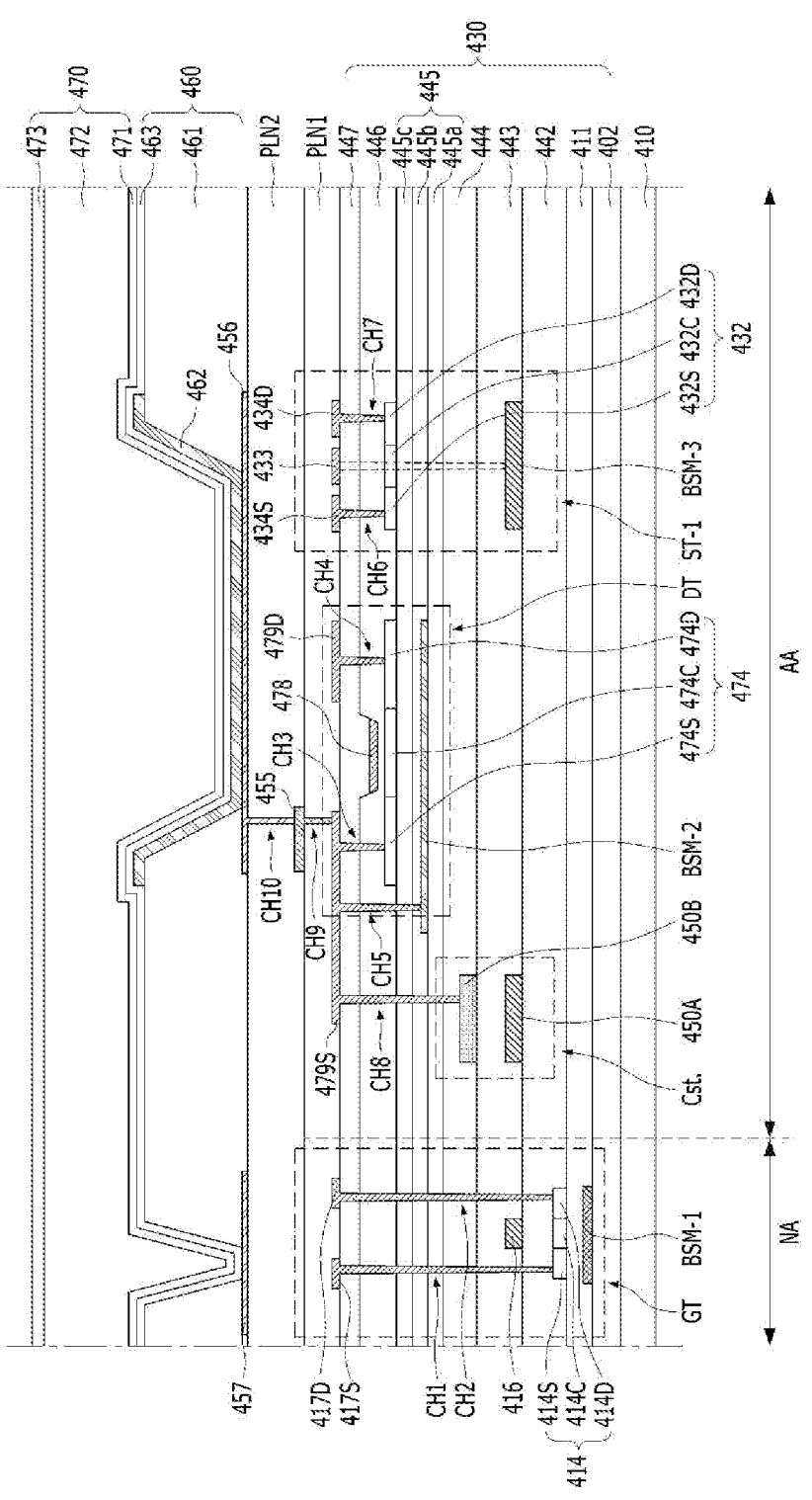
FIG. 4A is a cross-sectional view showing one thin film transistor for a gate driving circuit disposed at a gate driving circuit part in a non-active area, a driving thin film transistor disposed in an active area while including a gate insulating layer including a sink, a switching thin film transistor, and a storage capacitor according to a first embodiment of the present disclosure.

Next, FIG. 4A is a cross-sectional view showing one thin film transistor GT for a gate driving circuit, which is a representative thin film transistor disposed in a non-active area NA, in particular, a gate-in-panel (GIP) area, while including a polycrystalline semiconductor pattern, a driving thin film transistor DT disposed in a sub-pixel in an active area AA, while including an oxide semiconductor pattern configured to drive a light emitting element, a first switching thin film transistor ST-1 including an oxide semiconductor pattern, and a storage capacitor Cst, according to a first embodiment of the present disclosure.

As shown in FIG. 4A, the driving thin film transistor DT and the first switching thin film transistor ST-1 are disposed in a sub-pixel on a substrate 410. Although the driving thin film transistor DT and only one switching thin film transistor ST-1 are illustrated in FIG. 4A, this illustration is only for convenience of description, and a plurality of switching thin film transistors can actually be disposed on the substrate 410.

In addition, a plurality of thin film transistors GT for a gate driving circuit constituting a gate driver can be disposed in the non-active area NA on the substrate 410, in particular, the GIP area. The thin film transistor GT for the gate driving circuit, which will be referred to as a "gate driving thin film transistor GT," can use a polycrystalline semiconductor pattern as an active layer thereof.

Although the gate driving thin film transistor GT including the polycrystalline semiconductor pattern is disposed in the non-active area NA is described in the first embodiment, a switching thin film transistor having the same structure as that of the gate driving thin film transistor GT can be disposed in the sub-pixel. For example, the gate driving thin film transistor GT disposed in the non-active area NA and the switching thin film transistor disposed in the active area AA can have different configurations, like an N-type thin film transistor and a P-type thin film transistor, because kinds of impurities implemented therein are different.

In addition, the plurality of thin film transistors disposed in the gate driver can constitute a complementary metal-oxide-semiconductor (CMOS) configuration, in which a thin film transistor for a gate driving circuit including a polycrystalline semiconductor pattern and a switching thin film transistor including an oxide semiconductor pattern are paired. The following description will be given for a thin film transistor of a gate driving circuit using a polycrystalline semiconductor pattern as an active layer thereof is disposed in the non-active area NA.

In more detail, the gate driving thin film transistor GT includes a polycrystalline semiconductor pattern 414 disposed on a lower buffer layer 402/411 formed on the substrate 410, a first gate insulating layer 442 configured to insulate the polycrystalline semiconductor pattern 414, a first gate electrode 416 disposed on the first gate insulating layer 442 while overlapping with the polycrystalline semiconductor pattern 414, a plurality of insulating layers formed on the first gate electrode 416, and a first source electrode 417S and a first drain electrode 417D disposed on the plurality of insulating layers.

Further, the substrate 410 can be a multilayer structure including an organic layer and an inorganic layer alternately stacked. For example, the substrate 410 can have a multilayer structure including an organic layer of, for example, polyimide, and an inorganic layer of, for example, silicon oxide ($SiO_2$), alternately stacked.

In addition, the lower buffer layer 402/411 is formed on the substrate 410 and functions to prevent moisture, etc. from penetrating the display device from the outside. The lower buffer layer 402/411 can be formed by depositing an inorganic insulating layer of, for example, silicon oxide ($SiO_2$), in one or a plurality of layers.

Also, the lower buffer layer 402/411 can include a plurality of layers including a first lower buffer layer 402 and a second lower buffer layer 411. In addition, a first light shielding pattern BSM-1 configured to protect the polycrystalline semiconductor pattern 414 from external light, can be provided on the first lower buffer layer 402. Further, the first light shielding pattern BSM-1 can be disposed between the first lower buffer layer 402 and the second lower buffer layer 411.

In addition, the polycrystalline semiconductor pattern 414 is formed on the lower buffer layer 402/411 and is used as the active layer of the thin film transistor. As shown, the polycrystalline semiconductor pattern 414 includes a first channel region 414C, and a first source region 414S and a first drain region 414D facing each other under the condition that the first channel region 414C is interposed therebetween.

Further, the polycrystalline semiconductor pattern 414 is insulated by the first gate insulating layer 442. In particular, the first gate insulating layer 442 is formed by depositing an inorganic insulating layer of, for example, silicon oxide ($SiO_2$), in a number of at least one layer on the entire surface of the substrate 410 formed with the polycrystalline semiconductor pattern 414. Thus, the first gate insulating layer 442 protects and insulates the polycrystalline semiconductor pattern 414 from the outside.

In addition, the first gate electrode 416 overlapping with the first channel region 414C of the polycrystalline semiconductor pattern 414 is formed on the first gate insulating layer 442. Also, the first gate electrode 416 can be made of a metal material. For example, the first gate electrode 416 can take the form of a single layer or multiple layers made of one or more of molybdenum (Mo), aluminum (Al), chromium (Cr), gold (Au), titanium (Ti), nickel (Ni), neodymium (Nd), and copper (Cu) or an alloy thereof, without being limited thereto. A plurality of insulating layers can also be formed between the first gate electrode 416 and each of the first source electrode 417S and the first drain electrode 417D.

Referring to FIG. 4A, the plurality of insulating layers can be a first interlayer insulating layer 443 contacting an upper surface of the first gate electrode 416, and a second interlayer insulating layer 444, an upper buffer layer 445, a second gate insulating layer 446, and a third interlayer insulating layer 447 sequentially stacked on the first interlayer insulating layer 443 in this order. That is, a bottom surface of the second interlayer insulating layer 444 directly contacts an upper surface of the first interlayer insulating layer 443, a bottom surface of the upper buffer layer 445 directly contacts an upper surface of the second interlayer insulating layer 444, a bottom surface of the second gate insulating layer 446 directly contacts an upper surface of the upper buffer layer 445, and a bottom surface of the third interlayer insulating layer 447 directly contacts an upper surface of the second gate insulating layer 446.

Further, the first source electrode 417S and the first drain electrode 417D are disposed on the third interlayer insulating layer 447. In more detail, the first source electrode 417S and the first drain electrode 417D are connected to the polycrystalline semiconductor pattern 414 through a first contact hole CH1 and a second contact hole CH2, respectively. The first contact hole CH1 and the second contact hole CH2 extend through the first gate insulating layer 442, the first interlayer insulating layer 443, the second interlayer insulating layer 444, the upper buffer layer 445, the second gate insulating layer 446, and the third interlayer insulating layer 447, thereby exposing the first source region 414S and the first drain region 414D of the polycrystalline semiconductor pattern 414, respectively. In addition, the driving thin film transistor DT, the first switching thin film transistor ST-1, and the storage capacitor Cst are disposed at the sub-pixel in an active area AA.

In the first embodiment, each of the driving thin film transistor DT and the first switching thin film transistor ST-1 uses an oxide semiconductor material as an active layer thereof. Further, the driving thin film transistor DT includes a first oxide semiconductor pattern 474, and a second gate electrode 478, a second source electrode 479S, and a second drain electrode 479D overlapping with the first oxide semiconductor pattern 474.

Also the oxide semiconductor can be made of an oxide of a metal, such as zinc (Zn), indium (In), gallium (Ga), tin (Sn), titanium (Ti), or the like, or a combination of a metals, such as zinc (Zn), indium (In), gallium (Ga), tin (Sn), titanium (Ti), or the like and an oxide thereof. More specifically, the oxide semiconductor can include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

Generally, a polycrystalline semiconductor pattern advantageous in terms of high-speed operation is used as an active layer of a driving thin film transistor. In the case of a driving thin film transistor including a polycrystalline semiconductor pattern, there can be a problem in terms of power consumption in that leakage current is generated in an off state of the driving thin film transistor. In particular, the problem of generation of leakage current in an off state of the driving thin film transistor can be severe when the display device is driven at a low speed to display a still image, such as a document screen. Thus, in the first embodiment of the present disclosure, a driving thin film transistor using, as an active layer thereof, an oxide semiconductor pattern advantageous in preventing generation of leakage current while being capable of adjusting a threshold voltage, thereby achieving free grayscale expression within a wide range, is proposed.

However, when the thin film transistor uses an oxide semiconductor pattern as an active layer thereof, a current fluctuation value with respect to a voltage fluctuation value can be great due to characteristics of an oxide semiconductor material and, as such, failure can frequently occur in a low-grayscale range in which precise current control is required. In addition, the driving thin film transistor using the oxide semiconductor pattern as the active layer thereof has a high threshold voltage and, as such, exhibits a limitation in grayscale expression.

Therefore, according to the first embodiment of the present disclosure, a driving thin film transistor, in which fluctuation in current, is relatively insensitive to fluctuation in a voltage applied to a gate electrode, and a threshold voltage is adjustable in order to achieve grayscale expression, even at low gray levels, is proposed.

Figure 4B:
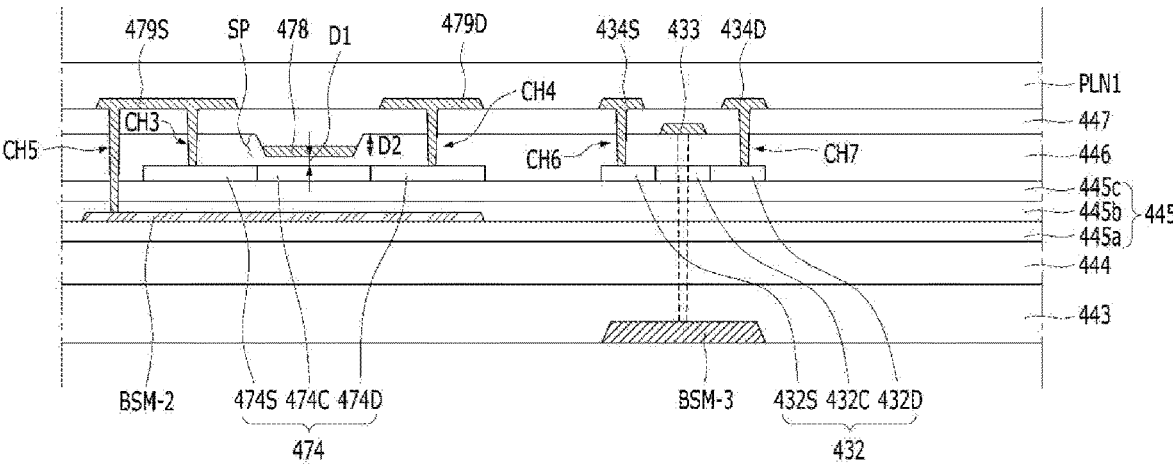
FIG. 4B is an enlarged cross-sectional view in which only the driving thin film transistor and the switching thin film transistor shown in FIG. 4A are enlarged.
Figure 4C:
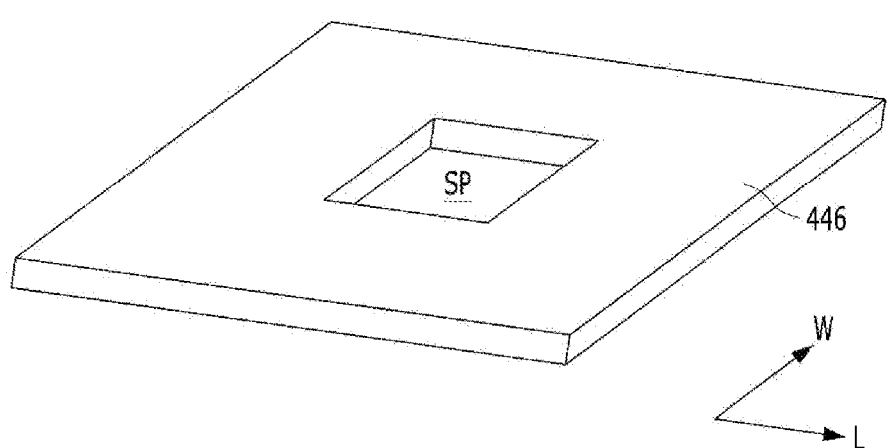
FIG. 4C is a perspective view showing inclusion of the sink in a portion of a second gate insulating layer according to the first embodiment of the present disclosure.
Figure 4D:
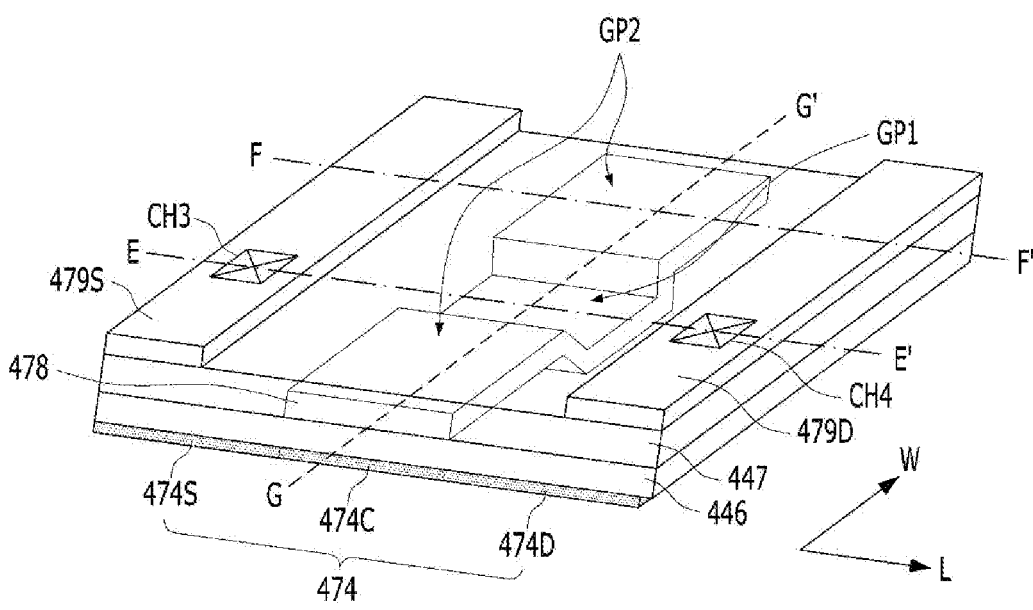
FIG. 4D is a perspective view showing a portion of the driving thin film transistor shown in FIG. 4B.
Figure 4E:
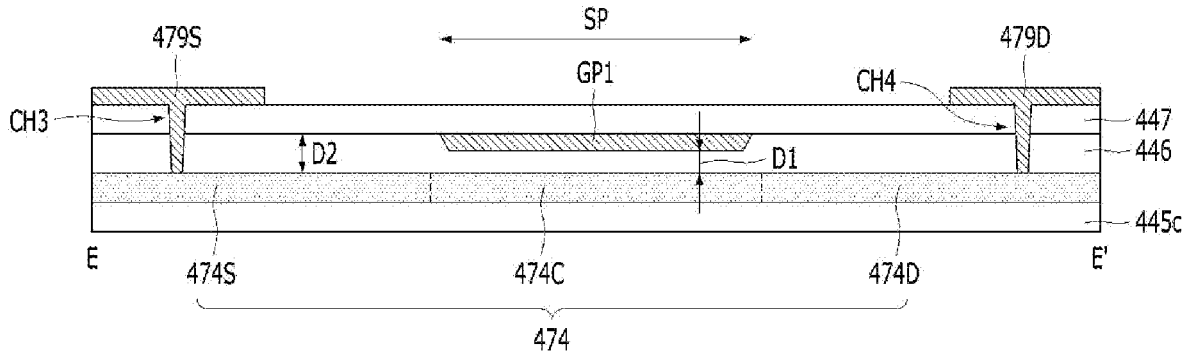
FIG. 4E is a cross-sectional view of the driving thin film transistor taken along line E-E' in FIG. 4D.
Figure 4F:
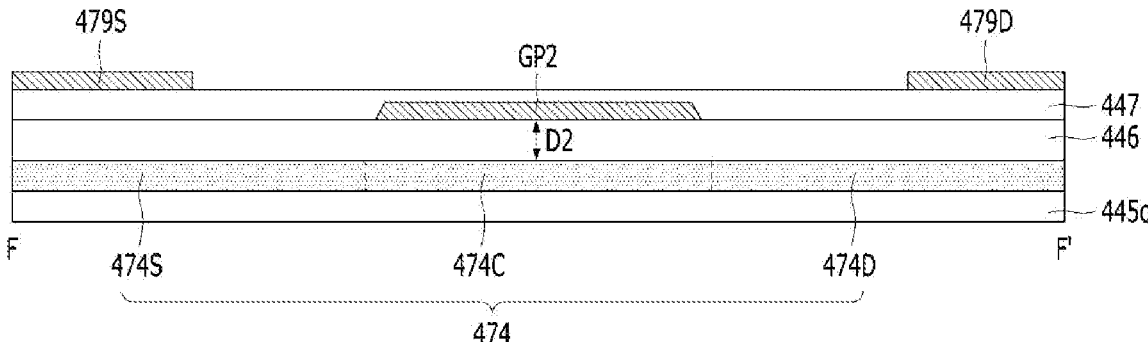
FIG. 4F is a cross-sectional view of the driving thin film transistor taken along line F-F' in FIG. 4D.

A structure of the driving thin film transistor according to the first embodiment of the present disclosure will be described with reference to FIGS. 4A to 4F. In particular, FIG. 4B is an enlarged cross-sectional view in which only the driving thin film transistor DT and the first switching thin film transistor ST-1 shown in FIG. 4A are enlarged. Also, FIG. 4C is a perspective view of a portion of the driving thin film transistor DT shown in FIG. 4A. In addition, FIGS. 4D to 4F show cross-sectional structures of FIG. 4C taken along lines E-E', F-F', and G-G', respectively.

The driving thin film transistor DT includes the first oxide semiconductor pattern 474, which is disposed on the upper buffer layer 445, the second gate electrode 478, which is disposed over the first oxide semiconductor pattern 474 while overlapping with the first oxide semiconductor pattern 474, the second gate insulating layer 446, the second gate insulating layer 446 is interposed between the first oxide semiconductor pattern 474 and the second gate electrode 478, the third interlayer insulating layer 447 covering the second gate electrode 478, a second light shielding pattern BSM-2 disposed under the first oxide semiconductor pattern 474 while overlapping with the first oxide semiconductor pattern 474, and the second source electrode 479S and the second drain electrode 479D, which are disposed on the third interlayer insulating layer 447. In particular, the second light shielding pattern BSM-2 is connected to the second source electrode 479S via a fifth contact hole CH5.

In addition, the second interlayer insulating layer 446 includes at least two portions respectively having different thicknesses and, as such, includes at least two portions respectively having different parasitic capacitances between the second gate electrode 478 and the first oxide semiconductor pattern 474. For example, the second interlayer insulating layer 446 includes a sink SP recessed toward the first oxide semiconductor pattern 474 at a portion of an upper surface thereof.

Hereinafter, a structure of the second interlayer insulating layer 446 including the sink SP according to the first embodiment of the present disclosure will be described with reference to FIGS. 4B and 4C. Referring to FIGS. 4B and 4C, the second gate insulating layer 446 is recessed toward the first oxide semiconductor pattern 474 in a region where the second gate insulating layer 446 overlaps with the first oxide semiconductor pattern 474.

In a plan view, as shown in FIG. 4C, the sink SP can have a quadrangular shape having a predetermined length in a longitudinal direction L of a second channel region 474C and a predetermined width in a width direction W of the second channel region 474C. For reference, the longitudinal direction L of the second channel region 474C is defined as a direction extending from the second source electrode 479S to the second drain electrode 479D, and the width direction W of the second channel region 474C is defined as a direction intersecting the longitudinal direction L. Accordingly, the thickness of the second gate insulating layer 446 at the sink SP is smaller than the thickness of the second gate insulating layer 446 in a region other than the sink SP.

In addition, the sink SP is formed in a region overlapping with the second channel region 474C of the first oxide semiconductor pattern 474. The sink SP overlaps with a portion of the second channel region 474C. In particular, the sink SP can be disposed to overlap with a central portion of the second channel region 474C.

When the sink SP has a rectangular shape, the length of the sink SP can be equal to or greater than at least the length of the second channel region 474C. In addition, although only one sink SP is shown in FIG. 4C, the sink SP can be disposed in a number of at least one in the width direction of the second channel region 474C. That is, a plurality of sinks SP can be disposed along the width direction or length direction of the second channel region 474C. The second gate electrode 478 can be deposited on an upper surface of the second gate insulating layer 446 including the sink SP, as described above.

Referring to FIG. 4D, the second gate electrode 478 can be deposited on the second gate insulating layer 446 including the sink SP along a curvature of an upper surface of the second gate insulating layer 446. That is, the upper surface of the second gate insulating layer 446 can include a curved surface, and the second gate electrode 478 can be deposited/ disposed on this curved surface of the second gate insulating layer 446.

Accordingly, the second gate electrode 478 includes both a first portion GP1 maintaining a first vertical distance D1 from the first oxide semiconductor pattern 474 and a second portion GP2 maintaining a second vertical distance D2 greater than the first vertical distance D1 from the first oxide semiconductor pattern 474.

For example, the first portion GP1 of the second gate electrode 478 is disposed near the first oxide semiconductor pattern 474 at the sink SP, and the second portion GP2 of the second gate electrode 478 is disposed farther from the first oxide semiconductor pattern 474 than the first portion GP1 of the second gate electrode 478 in a region other than the sink SP. That is, the first portion GP1 of the second gate electrode 478 overlaps the sink SP and the second portion GP2 of the second gate electrode 478 does not overlap the sink SP.

The length of the second gate electrode 478 can be equal to the length of the second channel region 474C. Also, the length of the sink SP is equal to or greater than the length of the second gate electrode 478 and, as such, the entirety of the second gate electrode 478 can be disposed within the sink SP in a longitudinal direction of the second gate electrode 478 when the second gate electrode 478 is formed within the sink SP.

Accordingly, the first portion GP1 of the second gate electrode 478 maintains the first vertical distance D1 from the first oxide semiconductor pattern 474, and the second portion GP2 of the second gate electrode 478 disposed over the second gate insulating layer 446, except for the sink SP, maintains the second vertical distance D2 from the first oxide semiconductor pattern 474. Here, the first vertical distance D1 is smaller than the second vertical distance D2. That is, the first portion GP1 can have constant thickness, such that the first vertical distance D1 from the first oxide semiconductor pattern 474 is constant. Likewise, the second portion GP2 can have constant thickness, such that the second vertical distance D2 from the first oxide semiconductor pattern 474 is constant. Additionally, the second gate electrode 478 can have a transition portion between the first portion GP1 and the second portion GP2, the transition portion can be a planar surface or a curved surface. Further, the transition portion between the first portion GP1 and the second portion GP2 can be angled from the second portion GP2 towards the first oxide semiconductor pattern 474.

In addition, referring to FIG. 4D, the second source electrode 479S and the second drain electrode 479D can be disposed while facing each other under the condition that the second gate electrode 478 is interposed therebetween. The third interlayer insulating layer 447 can be interposed between the second gate electrode 478 and the second source electrode 479S and the second drain electrode 479D.

Referring to FIG. 4D, the first portion GP1 of the second gate electrode 478 disposed at the sink SP, the second source electrode 479S and the second drain electrode 479D disposed at opposite sides of the second gate electrode 478, and the first oxide semiconductor pattern 474 can constitute a first sub-driving thin film transistor. In addition, the second portion GP2 of the second gate electrode 478, the second source electrode 479S, the second drain electrode 479D, and the first oxide semiconductor pattern 474 can constitute a second sub-driving thin film transistor.

The first sub-driving thin film transistor has a feature in that the second gate electrode 478 maintains the first vertical distance D1 from the first oxide semiconductor pattern 474, and the second sub-driving thin film transistor has a feature in that the second gate electrode 478 maintains the second vertical distance D2 from the first oxide semiconductor pattern 474.

In addition, the first sub-driving thin film transistor and the second sub-driving thin film transistor can be regarded as having a parallel connection structure in that the first sub-driving thin film transistor and the second sub-driving thin film transistor share the second gate electrode 478, the second source electrode 479S, and the second drain electrode 479D in common.

In addition, the first portion GP1 of the second gate electrode 478 and the first oxide semiconductor pattern 474 in the first sub-driving thin film transistor form a first parasitic capacitance, and the second portion GP2 of the second gate electrode 478 and the first oxide semiconductor pattern 474 form a second parasitic capacitance smaller than the first parasitic capacitance. As a result, the threshold voltage of the first sub-driving thin film transistor is lower than the threshold voltage of the second sub-driving thin film transistor. Thus, the first sub-driving thin film transistor turns on at a low voltage and, as such, can take charge of grayscale expression of the driving thin film transistor at low gray levels.

Figure 5:
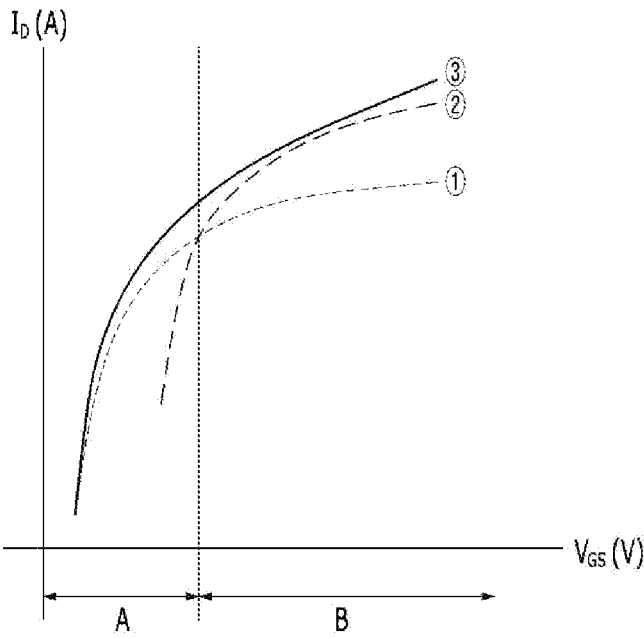
FIG. 5 is graphs depicting I-V curves of sub-thin film transistors created in the driving thin film transistor of the embodiment of the present disclosure and synthesis relations thereof.

A V-I (voltage in volts-current in ampere) curve of the driving thin film transistor will be described with reference to FIG. 5. A curve ① of FIG. 5 represents a V-I curve of the first sub-driving thin film transistor, which has a low threshold voltage (e.g., lower threshold voltage than the threshold voltage of the second sub-driving thin film transistor). For example, the first sub-driving thin film transistor can turn on in a low voltage range because the threshold voltage thereof is relatively low and, as such, the driving thin film transistor can operate in a range A (voltage range A) that is a low voltage range. This means that the driving thin film transistor turns on even at low gray levels.

On the other hand, a curve ② of FIG. 5 represents a V-I curve of the second sub-driving thin film transistor which has a relatively high threshold voltage as compared to the first sub-driving thin film transistor. For example, the second sub-driving thin film transistor can turn on only when the voltage applied thereto reaches a range B (voltage range B) that is a high voltage range, because the threshold voltage thereof is relatively high.

In addition, current flowing through the first sub-driving thin film transistor increases in synchronization with operation of the second sub-driving thin film transistor after the second sub-driving thin film transistor turns on. As a result, a synthetic current value can be represented as shown by a curve ③ of FIG. 5.

Thus, the driving thin film transistor DT according to the embodiment of the present disclosure can operate in a wide voltage range (e.g., range A and range B of FIG. 5) because the first sub-driving thin film transistor and the second sub-driving thin film transistor have a parallel connection configuration and, as such, can achieve grayscale expression in a wide voltage range. In particular, it can be possible to compensate for disadvantages of an oxide thin film transistor which has a difficulty in low-grayscale expression, even though it is advantageous in terms of blocking of leakage current when an oxide semiconductor pattern is used as an active layer.

Referring to FIG. 4D, the driving thin film transistor DT according to the embodiment of the present disclosure can have a configuration including one first sub-driving thin film transistor disposed at a middle portion of the driving thin film transistor DT and two second sub-driving thin film transistors respectively disposed at opposite sides of the first sub-driving thin film transistor. However, this configuration is only illustrative, and the first sub-driving thin film transistor and the second sub-driving thin film transistor can be provided in plural such that plural first sub-driving thin film transistors and plural second sub-driving thin film transistors are arranged in the width direction of the second channel region. In addition, the structure of the driving thin film transistor DT will be described in more detail through cross-sectional views referring to FIGS. 4E to 4G.

FIG. 4E shows a portion of a cross-section of the driving thin film transistor DT taken along line E-E' in FIG. 4D. The second gate insulating layer 446 includes the sink SP in a region corresponding to the second channel region 474D (e.g., a partial section of the second channel region 474D). The sink SP can have a structure recessed toward the first oxide semiconductor pattern 474 through removal of a portion of the second gate insulating layer 446. In addition, the first portion GP1 of the second gate electrode is disposed at the sink SP. The first portion GP1 of the second gate electrode and the first oxide semiconductor pattern 474 are spaced apart from each other by the first vertical distance D1. The first vertical distance D1 is smaller than the second vertical distance D2, which can be the thickness of the second gate insulating layer 446.

FIG. 4F shows a portion of a cross-section of the driving thin film transistor DT taken along line F-F' in FIG. 4D. In FIG. 4F, the second portion GP2 of the second gate electrode is spaced apart from the second channel region 474D of the first oxide semiconductor pattern 474 by the second vertical distance D2. The second portion GP2 of the second gate electrode is disposed on the second gate insulating layer 446 in a region not overlapping with the sink SP.

Figure 4G:
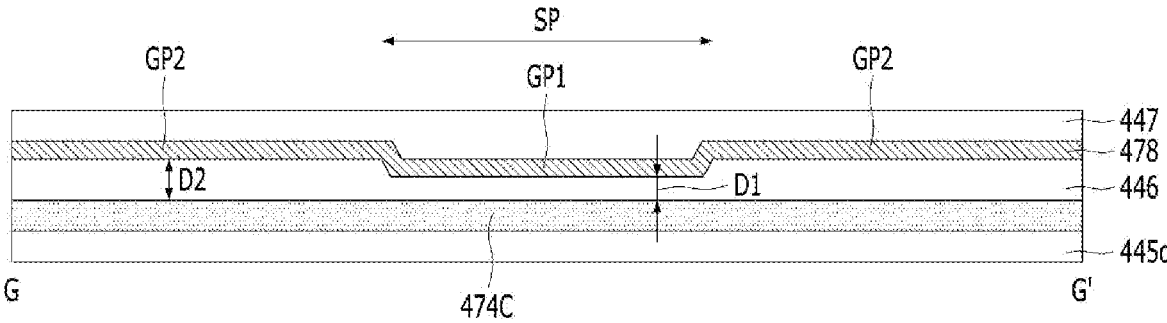
FIG. 4G is a cross-sectional view of the driving thin film transistor taken along line G-G' in FIG. 4D.

FIG. 4G shows a portion of a cross-section of the driving thin film transistor DT taken along line G-G' in FIG. 4D in the width direction of the second channel region 474C. In FIG. 4G, the second gate electrode 478 is disposed on (e.g., directly on) the second gate insulating layer 446 including the sink SP.

In addition, the second source electrode 479S of the driving thin film transistor DT is electrically connected to the second light shielding pattern BSM-2. When the second light shielding pattern BSM-2 is electrically connected to the second source electrode 479S, the following additional effect can be obtained.

As the second source region 474S and the second drain region 474D of the first oxide semiconductor pattern 474 become conductive, a parasitic capacitance Cact is generated in the first oxide semiconductor pattern 474 in an on/off operation. In addition, a parasitic capacitance Cgi is generated between the second gate electrode 478 and the first oxide semiconductor pattern 474. In addition, a parasitic capacitance Cbuf is generated between the second light shielding pattern BSM-2 electrically connected to the second source electrode 479S and the first oxide semiconductor pattern 474.

Since the first oxide semiconductor pattern 474 and the second light shielding pattern BSM-2 are electrically interconnected by the second source electrode 479S, the parasitic capacitance Cact and the parasitic capacitance Cbuf are connected in parallel, and the parasitic capacitance Cact and the parasitic capacitance Cgi are connected in series. In addition, when a gate voltage of Vgat is applied to the second gate electrode 478, an effective voltage Veff actually applied to the first oxide semiconductor pattern 474 satisfies the following Expression 1.

$$\Delta V_{\text{eff}} = \frac{C_{gi}}{C_{gi} + C_{buf} + C_{act}} * \Delta V_{gat} \qquad \text{[Expression 1]}$$

Thus, the effective voltage Veff applied to the second channel region 474C is inversely proportional to the parasitic capacitance Cbuf and, as such, it can be possible to adjust the effective voltage Veff applied to the first oxide semiconductor pattern 474 by adjusting the parasitic capacitance Cbuf. For example, when the second light shielding pattern BSM-2 is disposed near the first oxide semiconductor pattern 474, to increase the parasitic capacitance Cbuf, it can be possible to reduce an actual value of current flowing through the first oxide semiconductor pattern 474.

Reduction in the effective value of current flowing through the first oxide semiconductor pattern 474 means that an s-factor can be increased, and means that an actual control range of the driving thin film transistor DT controllable through the voltage Vgat applied to the second gate electrode 478 can be widened.

For example, when the second source electrode 479S of the driving thin film transistor DT is electrically connected to the second light shielding pattern BSM-2, and the second light shielding pattern BSM-2 is disposed near the first oxide semiconductor pattern 474, it can be possible to accurately control the organic light emitting element even at low gray levels and, as such, to solve a problem of a Mura defect frequently generated at low gray levels.

Accordingly, in the first embodiment of the present disclosure, the parasitic capacitance Cbuf generated between the first oxide semiconductor pattern 474 and the second light shielding pattern BSM-2 can be greater than the parasitic capacitance Cgi generated between the second gate electrode 478 and the first oxide semiconductor pattern 474.

Here, "s-factor" means a reciprocal value of a current variation to a gate voltage variation in an on/off transition period of a thin film transistor. For example, the s-factor can be a reciprocal value of a gradient of a curve in a characteristic graph of a drain current with respect to a gate voltage (V-I curve graph).

A small s-factor means a great gradient of a characteristic graph of a drain current with respect to a gate voltage. Accordingly, when a thin film transistor has a small s-factor, the thin film transistor can be turned on even by a low voltage and, as such, switching characteristics of the thin film transistor become better. However, sufficient grayscale expression is difficult because the thin film transistor reaches a threshold voltage within a short time.

A great s-factor means a small gradient of the characteristic graph of the drain current with respect to the gate voltage. Accordingly, when a thin film transistor has a great s-factor, the on/off response time of the thin film transistor can be degraded and, as such, switching characteristics of the thin film transistor can be degraded. However, sufficient grayscale expression can be possible because the thin film transistor reaches a threshold voltage after a relatively long time.

In particular, the second light shielding pattern BMS-2 can be disposed near the first oxide semiconductor pattern 474 while being embedded in the upper buffer layer 445. Of course, use of a plurality of sub-upper buffer layers is illustrated in the first embodiment. For example, the upper buffer layer 445 can have a structure in which a first sub-upper buffer layer 445a, a second sub-upper buffer layer 445b, and a third sub-upper buffer layer 445c are sequentially stacked. The second light shielding pattern BSM-2 can be formed over the first sub-upper buffer layer 445a. In addition, the second sub-upper buffer layer 445b can completely cover (e.g., completely covers) the second light shielding pattern BSM-2. In addition, the third sub-upper buffer layer 45c is formed over the second sub-upper buffer layer 445b. This configuration is one example of a configuration in which the second light shielding pattern BSM-2 is embedded in the upper buffer layer 445.

The first sub-upper buffer layer 445a and the third sub-upper buffer layer 445c can be constituted by silicon oxide (SiO2). The first sub-upper buffer layer 445a and the third sub-upper buffer layer 445c are constituted by silicon oxide (SiO2) not including hydrogen particles, thereby preventing hydrogen particles from penetrating into the oxide semiconductor pattern during heat treatment. When hydrogen particles penetrate into the oxide semiconductor pattern, reliability of the thin film transistor is degraded.

On the other hand, the second sub-upper buffer layer 445b can be constituted by silicon nitride (SiNx) having an excellent hydrogen particle collection ability. That is, the first sub-upper buffer layer 445a and the third sub-upper buffer layer 445c are constituted by silicon oxide (SiO2) not including hydrogen particles and the second sub-upper buffer layer 445b can be constituted by silicon nitride (SiNx).

In addition, in FIG. 4A, the second sub-upper buffer layer 445b can be formed only in a region where the second light shielding pattern BSM-2 is formed in order to completely encapsulate the second light shielding pattern BSM-2. For example, a silicon nitride (SiNx) layer can be partially formed on the first sub-upper buffer layer 445a in order to completely cover an upper surface and a side surface of the second light shielding pattern BSM-2.

In addition, as shown in FIGS. 4A and 4B, the second sub-upper buffer layer 445b can be formed over the entire surface on the first sub-upper buffer layer 445a formed with the second light shielding pattern BSM-2. Silicon nitride (SiNx) is excellent in terms of hydrogen particle collection ability, as compared to silicon oxide (SiO2). When hydrogen particles penetrate into an active layer constituted by an oxide semiconductor material, resultant thin film transistors can have a problem in that the thin film transistors have different threshold voltages or different conductivities at channels thereof, which can cause the reliability of the thin film transistors to be degraded. In particular, in the case of a driving thin film transistor, securing reliability is important because the driving thin film transistor directly contributes to operation of the light emitting element associated therewith.

Accordingly, it can be possible to prevent degradation in reliability of the driving thin film transistor DT caused by hydrogen particles by partially or completely forming the second sub-upper buffer layer 445b covering the second light shielding pattern BSM-2 over (e.g., directly over) the first sub-upper buffer layer 445a.

When the second sub-upper buffer layer 445b is partially deposited on the first sub-upper buffer layer 445a, there is an advantage as follows. For example, since the second sub-upper buffer layer 445b is formed of a material different from that of the first sub-upper buffer layer 445a, layer blister (e.g., layer blistering or separation, which can be caused by the buildup of pressure) can occur between the heterogeneous material layers when the second sub-upper buffer layer 445b is deposited over the entire surface of the active area. In order to solve such a problem, the second sub-upper buffer layer 445b can be selectively formed only in a region where the second light shielding pattern BSM-2 is formed, for enhancement in bonding force/strength.

Preferably, the second light shielding pattern BSM-2 be formed vertically under the first oxide semiconductor pattern 474, to overlap with the first oxide semiconductor pattern 474. In addition, the second light shielding pattern BSM-2 can be formed to have a size greater than that of the first oxide semiconductor pattern 474, to completely overlap with the first oxide semiconductor pattern 474.

The second light shielding pattern BSM-2 can be disposed near the first oxide semiconductor pattern 474, thereby increasing the parasitic capacitance generated between the first oxide semiconductor pattern 474 and the second light shielding pattern BSM-2. In this instance, the s-factor of the driving thin film transistor DT is increased and, as such, the driving thin film transistor can additionally achieve grayscale expression even at low gray levels.

In addition, the second gate electrode 478 of the driving thin film transistor DT is insulated by the third interlayer insulating layer 447. The second source electrode 479S and the second drain electrode 479D are formed on the third interlayer insulating layer 447.

Although the second source electrode 479S and the second drain electrode 479D are shown as being disposed on the same layer, and the second gate electrode 478 is shown as being formed on a layer different from that of the second source electrode 479S and the second drain electrode 479D in the first embodiment of the present disclosure referring to FIG. 4A, all of the second gate electrode 478, the second source electrode 479S, and the second drain electrode 479D can be disposed on the same layer.

The second source electrode 479S and the second drain electrode 479D are connected to the second source region 474S and the second drain region 474D via a third contact hole CH3 and a fourth contact hole CH4, respectively. That is, the second source electrode 479S is connected to the second source region 474S via the third contact hole CH3 and the second drain electrode 479D is connected to the second drain region 474D via the fourth contact hole CH4. In addition, the second light shielding pattern BSM-2 is connected to the second source electrode 479S via a fifth contact hole CH5. In addition, the first switching thin film transistor ST-1 includes a second oxide semiconductor pattern 432, a third gate electrode 433, a third source electrode 434S, and a third drain electrode 434D.

The second oxide semiconductor pattern 432 includes a third channel region 432C, and a third source region 432S, and a third drain region 432D disposed adjacent to the third channel region 432C under the condition that the third channel region 432C is interposed therebetween. That is, the third channel region 432C is interposed between the third source region 432S and the third drain region 432D.

The third gate electrode 433 is disposed over the second oxide semiconductor pattern 432 under the condition that the second gate insulating layer 446 is interposed therebetween (e.g., between the third gate electrode 433 and the second oxide semiconductor pattern 432.

The third source electrode 434S and the third drain electrode 434D can be connected to the third source region 432S and the third drain region 432D via a sixth contact hole CH6 and a seventh contact hole CH7, respectively. The third source electrode 434S and the third drain electrode 434D can be disposed on the same layer as the second source electrode 479S and the second drain electrode 479D. For example, the second source/drain electrodes 479S and 479D and the third source/drain electrodes 434S and 434D can be disposed on the third interlayer insulating layer 447.

Of course, the third source/drain electrodes 434S and 434D can be disposed on the same layer as the third gate electrode 433. For example, the third source/drain electrodes 434S and 434D can be formed on the second gate insulating layer 446 simultaneously with the third gate electrode 433, using the same material as that of the third gate electrode 433.

In addition, a third light shielding pattern BSM-3 can be disposed under the second oxide semiconductor pattern 432 (e.g., under an entirety of or less than an entirety of the second oxide semiconductor pattern 432). The third light shielding pattern BSM-3 can be formed over the first gate insulating layer 442, together with the first gate electrode 416. The third gate electrode 433 and the third light shielding pattern BSM-3 can be electrically interconnected, thereby constituting a dual gate.

In addition, referring to FIG. 4A, the sub-pixel includes a storage capacitor Cst. The storage capacitor Cst stores a data voltage applied thereto via a data line for a predetermined period, and then provides the stored data voltage to the organic light emitting element.

The storage capacitor Cst includes two electrodes corresponding to each other, and a dielectric disposed between the two electrodes. The storage capacitor Cst includes a first electrode 450A disposed on the same layer as the first gate electrode 416 and made of the same material as that of the first gate electrode 416, and a second electrode 450B facing the first electrode 450A while overlapping with the first electrode 450A. The second electrode 450B can be disposed on the second interlayer insulating layer 444.

The first interlayer insulating layer 443 can be interposed between the first electrode 450A and the second electrode 450B of the storage capacitor Cst. The second electrode 450B of the storage capacitor Cst can be electrically connected to the second source electrode 479S via an eighth contact hole CH8. In addition, there is an advantage in that mask processes are reduced because the first electrode 450A of the storage capacitor Cst is formed on the same layer as the first gate electrode 416 and the second light shielding pattern BSM-2.

In addition, referring to FIG. 4A, a first planarization layer PLN1 can be formed over the substrate 410 on which the driving thin film transistor DT and the first switching thin film transistor ST-1 are disposed. Although the first planarization layer PLN1 can be formed of an organic material, such as photoacryl, the first planarization layer PLN1 can also be constituted by a plurality of layers constituted by an inorganic layer and an organic layer. A connection electrode 455 is formed over the first planarization layer PLN1. The connection electrode 455 electrically interconnects an anode 456, which is one constituent element of a light emitting device part 460, and the driving thin film transistor DT via a ninth contact hole CH9 formed in the first planarization layer PLN1. The first planarization layer PLN1 can be directly disposed on the third interlayer insulating layer 447.

In addition, a conductive layer used to form the connection electrode 455 can constitute a part of various link lines disposed in a bending area BA. A second planarization layer PLN2 can be formed over the connection electrode 455 and the second planarization layer PLN2 can be directly disposed on the first planarization layer PLN1. Although the second planarization layer PLN2 can be formed of an organic material, such as photoacryl, and the second planarization layer PLN2 can also be constituted by a plurality of layers constituted by at least one inorganic layer and at least one organic layer.

The anode 456 is formed over the second planarization layer PLN2. The anode 456 is electrically connected to the connection electrode 455 via a tenth contact hole CH10 formed in the second planarization layer PLN2. The anode 456 can take the form of a single layer or multiple layers made of a metal, such as Ca, Ba, Mg, Al, Ag, etc. or an alloy thereof. The anode 456 is connected to the second drain electrode 479D of the driving thin film transistor DT and, as such, an image signal from the outside is applied thereto.

In addition to the anode 456, an anode connection electrode 457, which electrically interconnects a common voltage line VSS and a cathode 463, can be further provided in a non-active area NA. A bank layer 461 is formed over the second planarization layer PLN2. The bank layer 461 is a kind of barrier, and can partition sub-pixels, thereby preventing light of particular colors output from adjacent ones of the sub-pixels from being output in a mixed state.

An organic light emitting layer 462 is formed on a surface of the anode 456 and a portion of an inclined surface of the bank layer 461. The organic light emitting layer 462 may be an R-organic light emitting layer configured to emit red light, a G-organic light emitting layer configured to emit green light, or a B-organic light emitting layer configured to emit blue light, which is formed at each sub-pixel. In addition, the organic light emitting layer 462 may be a W-organic light emitting layer configured to emit white light.

The organic light emitting layer 462 may include not only a light emitting layer, but also an electron injection layer and a hole injection layer respectively configured to inject electrons and holes into the light emitting layer, an electron transportation layer and a hole transportation layer respectively configured to transport injected electrons and holes to an organic layer, etc. The cathode 463 is formed over the organic light emitting layer 462. The cathode 463 can be made of a transparent conductive material, such as indium tin oxide (ITO) or indium zinc oxide (IZO), or a thin metal allowing transmission of visible light therethrough, without being limited thereto.

An encapsulation layer part 470 is formed over the cathode 463. The encapsulation layer part 470 can be constituted by a single layer formed of an inorganic layer, a double layer of inorganic layer/organic layer, or a triple layer of inorganic layer/organic layer/inorganic layer. The inorganic layer can be constituted by an inorganic material, such as SiNx, SiX, or the like, without being limited thereto. In addition, the organic layer can be constituted by an organic material, such as polyethylene terephthalate, polyethylene naphthalate, polycarbonate, polyimide, polyethylene sulfonate, polyoxymethylene, polyarylate, etc., or a mixture thereof, without being limited thereto.

In FIG. 4A, an embodiment of the encapsulation layer part 470 is illustrated as being constituted by a triple layer of inorganic layer 471/organic layer 472/inorganic layer 473. A cover glass can be disposed over the encapsulation layer part 470, and can be attached to the encapsulation layer part 470 by an adhesive layer. Although any material can be used as the adhesive layer, so long as the material exhibits excellent attachment force while being excellent in terms of heat resistance and water resistance, a thermosetting resin, such as an epoxy-based compound, an acrylate-based compound, or an acryl-based rubber can be used in the present disclosure. Alternatively, a photo-curable resin can be used as the adhesive. In this instance, the adhesive layer is cured through irradiation of the adhesive layer with light, such as ultraviolet light.

The adhesive layer can not only serve to assemble the substrate 410 and the cover glass, but also to function as an encapsulator for preventing penetration of moisture into an interior of the display device which can be an organic electroluminescent display device. The cover glass can be an encapsulation cap for encapsulating the organic electroluminescent display device, and can use a protective film, such as a polystyrene (PS) film, a polyethylene (PE) film, a polyethylene naphthalate (PEN) film, a polyimide (PI) film, or the like, and can use glass.

Hereinafter, another embodiment of the present disclosure will be described with reference to FIGS. 6A to 6D. In the first embodiment of the present disclosure, the sink SP is formed at the second gate insulating layer 446, which has a single-layer structure, by removing a portion of the second gate insulating layer 446 such that the thickness of the second gate insulating layer 446 in a region corresponding to the sink SP is smaller than the thickness of the second gate insulating layer 446 in a region other than the region corresponding to the sink SP.

However, the sink SP can be formed to have a structure different from the above-described structure. This will be described with reference to FIGS. 6A to 6D. The following description will be given with reference to FIGS. 6A to 6D, and no description will be given of the same configuration as that of the first embodiment described above.

Figure 6A:
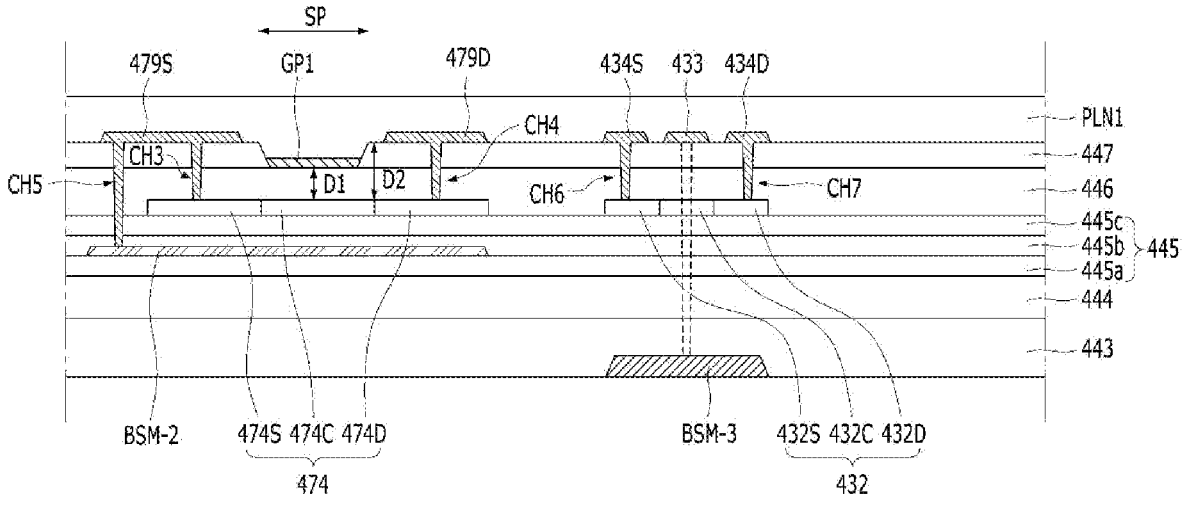
FIG. 6A is an enlarged cross-sectional view in which a driving thin film transistor and a switching thin film transistor according to another embodiment of the present disclosure are enlarged.

Referring to FIG. 6A, a sink SP is formed by removing a portion of a third interlayer insulating layer 447 corresponding to a second channel region 474C under the condition that the third interlayer insulating layer 447 is stacked on a second gate insulating layer 446 formed on a first oxide semiconductor pattern 474. In addition, a first portion GP1 of a second gate electrode 478 (FIG. 6D) is formed in the sink SP.

The second gate electrode 478, a second source electrode 479S, and a second drain electrode 479D can be formed on the third interlayer insulating layer 447, using the same conductive material. As a result, the first portion GP1 of the second gate electrode 478 is disposed on the first oxide semiconductor pattern 474 while maintaining a first distance D1 equal to the thickness of the second gate insulating layer 446 from the first oxide semiconductor pattern 474. In addition, a second portion GP2 of the second gate electrode 478 is disposed on the third interlayer insulating layer 447 while maintaining a second distance D2 equal to a sum of the first distance D1 equal to the thickness of the second gate insulating layer 446 and the thickness of the third interlayer insulting layer 447 from the first oxide semiconductor pattern 474.

Figure 6B:
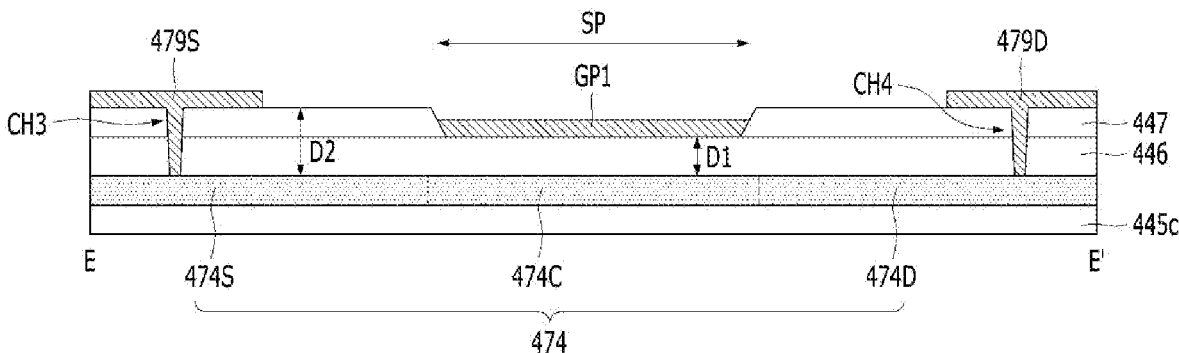
FIG. 6B is a cross-sectional view of the driving thin film transistor according to another embodiment of the present disclosure shown in FIG. 6A taken along line E-E' in FIG. 4D.
Figure 6C:
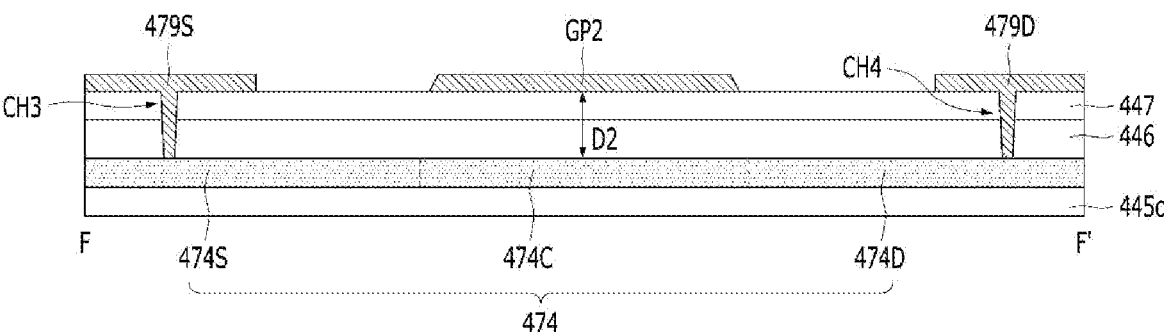
FIG. 6C is a cross-sectional view of the driving thin film transistor according to another embodiment of the present disclosure shown in FIG. 6A taken along line F-F' in FIG. 4D.
Figure 6D:
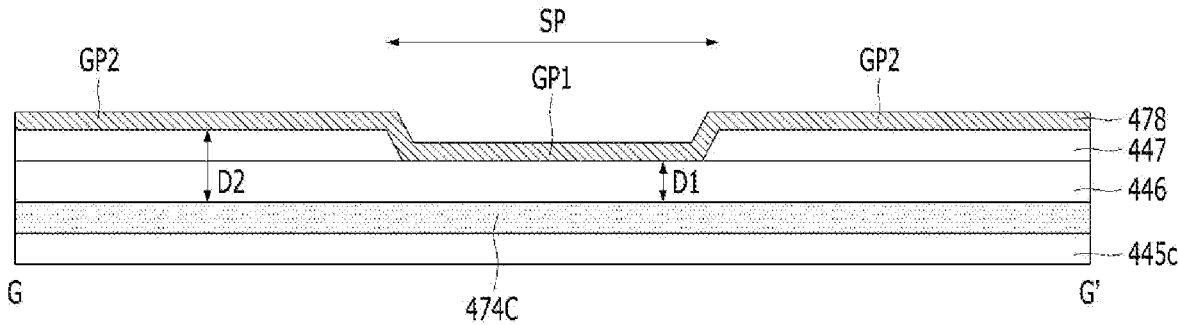
FIG. 6D is a cross-sectional view of the driving thin film transistor according to another embodiment of the present disclosure shown in FIG. 6A taken along line G-G' in FIG. 4D.

FIGS. 6B to 6D show portions of cross-sections of a driving thin film transistor according to the second embodiment of the present disclosure taken along lines E-E', F-F', and G-G' in FIG. 4D, respectively. Structures shown in FIGS. 6B to 6D can be understood through the first embodiment described with reference to FIGS. 4E to 4G and, as such, no description thereof will be given.

As apparent from the above description, according to exemplary embodiments of the present disclosure, a pixel includes a driving thin film transistor and a switching thin film transistor, which include oxide semiconductor patterns, thereby blocking leakage current in an off state. Accordingly, a reduction in power consumption can be achieved.

Although it is difficult to adjust a threshold voltage due to characteristics of an oxide semiconductor material, it can be possible to provide a driving thin film transistor having a threshold voltage adjusted to achieve grayscale expression within a wide range while using the oxide semiconductor material as an active layer thereof according to exemplary embodiments of the present disclosure. In addition, the driving thin film transistor can provide a structure capable of increasing an s-factor value and, as such, a thin film transistor array substrate capable of achieving free grayscale expression at low gray levels can be provided.

Effects of the present disclosure are not limited to the above-described effects. Other effects not described in the present disclosure can be readily understood by those skilled in the art from the appended claims.

It will be appreciated that the technical spirit of the present disclosure has been described herein only for purposes of illustration through the above description and the accompanying drawings, and that combination, separation, substitution, and modifications of components can be made by those skilled in the art without departing from the scope and spirit of the present disclosure. Therefore, the exemplary embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical ideas falling within a range equivalent to the claims are included in the protection scope of the present disclosure.

What is claimed is:

1. A thin film transistor array substrate comprising:
a substrate including:
an active area; and
a non-active area disposed around the active area; and a first thin film transistor disposed on the substrate, wherein the first thin film transistor comprises:

a first oxide semiconductor pattern disposed on the substrate;

a first gate electrode on the first oxide semiconductor pattern;

a first gate insulating layer interposed between the first oxide semiconductor pattern and the first gate electrode;

a first source electrode disposed on the first oxide semiconductor pattern and connected to the first oxide semiconductor pattern;

a first drain electrode disposed on the first oxide semiconductor pattern and connected to the first oxide semiconductor pattern; and a first light shielding pattern disposed under the first oxide semiconductor pattern and electrically connected to one of the first source electrode, the first gate electrode, and the first drain electrode, and wherein the first gate electrode comprises:

a first portion maintaining a first parasitic capacitance, together with a first channel region of the first oxide semiconductor pattern; and a second portion maintaining a second parasitic capacitance smaller than the first parasitic capacitance, together with the first channel region of the first oxide semiconductor pattern.

2. The thin film transistor array substrate according to claim 1, wherein the first parasitic capacitance is generated according to a first vertical distance between the first channel region of the first oxide semiconductor pattern and the first portion of the first gate electrode, wherein second parasitic capacitance is generated according to a second vertical distance between the first channel region of the first oxide semiconductor pattern and the second portion of the first gate electrode, and wherein the second vertical distance is greater than the first vertical distance.

3. The thin film transistor array substrate according to claim 1, wherein the first thin film transistor is a driving thin film transistor configured to drive a pixel disposed in the active area.

4. The thin film transistor array substrate according to claim 1, wherein a first thickness of the first gate insulating layer between the first portion of the first gate electrode and the first oxide semiconductor pattern is smaller than a second thickness of the first gate insulating layer between the second portion of the first gate electrode and the first oxide semiconductor pattern.

5. A display device comprising:

the thin film transistor array substrate according to claim 1; and a light emitting device part disposed on the thin film transistor array substrate, the light emitting device part including:

a first electrode connected to the first drain electrode;

a second electrode corresponding to the first electrode; and a light emitting layer disposed between the first electrode and the second electrode.

6. The thin film transistor array substrate according to claim 1, further comprising:

a second thin film transistor disposed in the active area, wherein the second thin film transistor comprises:

a second oxide semiconductor pattern;

a second gate electrode disposed on the second oxide semiconductor pattern;

a second light shielding pattern disposed under the second oxide semiconductor pattern while overlapping with the second oxide semiconductor pattern;

a second source electrode electrically connected to the second oxide semiconductor pattern; and a second drain electrode electrically connected to the second oxide semiconductor pattern.

7. The thin film transistor array substrate according to claim 6, wherein the second gate electrode and the second light shielding pattern are electrically interconnected to constitute a dual gate.

8. The thin film transistor array substrate according to claim 1, wherein the first gate insulating layer comprises a sink recessed toward the first oxide semiconductor pattern.

9. The thin film transistor array substrate according to claim 8, wherein the sink has a quadrangular shape in a plan view.

10. The thin film transistor array substrate according to claim 8, wherein the first gate insulating layer comprises at least one inorganic insulating layer.

11. The thin film transistor array substrate according to claim 10, wherein the at least one inorganic insulating layer of the first gate insulating layer comprises:

a first inorganic insulating layer covering the first oxide semiconductor pattern; and a second inorganic insulating layer disposed on the first inorganic insulating layer while comprising the sink.

12. The thin film transistor array substrate according to claim 8, wherein the first oxide semiconductor pattern comprises:

a first source region connected to the first source electrode;

a first drain region connected to the first drain electrode; and the first channel region disposed between the first source region and the first drain region, and wherein the sink has a length equal to or greater than a length of the first channel region.

13. The thin film transistor array substrate according to claim 12, wherein the first gate electrode overlaps the first channel region, and wherein the first gate electrode extends in a width direction of the first channel region along a curvature of an upper surface of the first gate insulating layer.

14. The thin film transistor array substrate according to claim 13, wherein the first portion of the first gate electrode is formed at the sink, and wherein the first gate electrode has a length equal to the length of the first channel region.

15. The thin film transistor array substrate according to claim 14, wherein the sink is disposed in a number of at least one in the width direction of the first channel region.

16. The thin film transistor array substrate according to claim 14, wherein the sink is disposed at a central portion of the first channel region, and wherein the second portion of the first gate electrode is disposed at opposite sides of the first portion.

17. A thin film transistor array substrate comprising:

a substrate;

a first thin film transistor disposed on the substrate, the first thin film transistor including:

a first oxide semiconductor pattern disposed on the substrate;

a first gate electrode on the first oxide semiconductor pattern;

a first gate insulating layer interposed between the first oxide semiconductor pattern and the first gate electrode;

a first source electrode connected to the first oxide semiconductor pattern; a first drain electrode connected to the first oxide semiconductor pattern; and a first light shielding pattern overlapping under the first oxide semiconductor pattern, and wherein the first gate electrode includes:

a first portion having a first vertical distance from a first channel region of the first oxide semiconductor pattern; and a second portion having a second vertical distance from the first channel region of the first oxide semiconductor pattern, the second vertical distance being greater than the first vertical distance.

18. The thin film transistor array substrate according to claim 17, wherein the substrate includes:

an active area; and a non-active area disposed around the active area, and wherein the first thin film transistor is disposed in the active area of the substrate.

19. The thin film transistor array substrate according to claim 18, wherein the first thin film transistor is a driving thin film transistor configured to drive a pixel disposed in the active area, wherein the first portion and the first channel region of the first oxide semiconductor pattern form a first parasitic capacitance, and wherein the second portion and the first channel region of the first oxide semiconductor pattern form a second parasitic capacitance smaller than the first parasitic capacitance.

20. The thin film transistor array substrate according to claim 19, wherein the first portion of the first gate electrode, the first source electrode and the first drain electrode constitute a first sub-driving thin film transistor, wherein the second portion of the first gate electrode, the first source electrode and the first drain electrode constitute a second sub-driving thin film transistor, and wherein the first sub-driving thin film transistor has a lower threshold voltage than the second sub-driving thin film transistor.

\* \* \* \* \*